United States Patent
Choi et al.

(10) Patent No.: US 9,691,487 B2
(45) Date of Patent: Jun. 27, 2017

(54) STORAGE DEVICE AND TABLE MANAGEMENT METHOD THEREOF

(71) Applicants: Wan-soo Choi, Suwon-si (KR); Byungjune Song, Suwon-si (KR)

(72) Inventors: Wan-soo Choi, Suwon-si (KR); Byungjune Song, Suwon-si (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 176 days.

(21) Appl. No.: 14/636,700

(22) Filed: Mar. 3, 2015

(65) Prior Publication Data

US 2015/0261617 A1    Sep. 17, 2015

(30) Foreign Application Priority Data

Mar. 14, 2014  (KR) .................. 10-2014-0030279

(51) Int. Cl.
  *G11C 16/26* (2006.01)
  *G11C 11/56* (2006.01)
  *G11C 16/34* (2006.01)
  *G11C 16/04* (2006.01)

(52) U.S. Cl.
  CPC .......... *G11C 16/26* (2013.01); *G11C 11/5642* (2013.01); *G11C 16/3418* (2013.01); *G11C 16/0483* (2013.01)

(58) Field of Classification Search
  USPC ....................................... 714/6.11
  See application file for complete search history.

(56) References Cited

U.S. PATENT DOCUMENTS

| 5,933,845 A | * | 8/1999 | Kopp | G06F 12/0246 365/185.29 |
| 7,127,551 B2 | | 10/2006 | Beck | |
| 7,679,133 B2 | * | 3/2010 | Son | H01L 21/8221 257/328 |
| 7,979,626 B2 | | 7/2011 | Rogers et al. | |
| 8,245,101 B2 | | 8/2012 | Olbrich et al. | |
| 8,553,466 B2 | * | 10/2013 | Han | G11C 16/04 365/185.18 |
| 8,559,235 B2 | * | 10/2013 | Yoon | G11C 16/0483 365/185.18 |
| 8,654,587 B2 | * | 2/2014 | Yoon | G11C 16/0483 365/185.05 |

(Continued)

FOREIGN PATENT DOCUMENTS

JP    2009087173 A    4/2009
KR    20120131579 A    12/2012

*Primary Examiner* — Kamini Patel

(57) ABSTRACT

According to example embodiments, a table management method includes determining whether a table associated with a page in at least one nonvolatile memory device needs to be recovered, performing a block scan operation on a block in the at least one nonvolatile memory device if the table needs to be recovered, recovering the table using a time difference read from each of a plurality of pages in the block during the block scan operation, and updating the recovered table to the at least one nonvolatile memory device. The table is associated with a page among the plurality of pages in the block. The time difference is time elapsed until a current page is programmed from program time of a previous page among the plurality of pages.

20 Claims, 15 Drawing Sheets

(56) References Cited

U.S. PATENT DOCUMENTS

| | | | |
|---|---|---|---|
| 2003/0101327 A1* | 5/2003 | Beck | G06F 12/0246 |
| | | | 711/206 |
| 2009/0172499 A1 | 7/2009 | Olbrich et al. | |
| 2009/0287874 A1* | 11/2009 | Rogers | G06F 11/1441 |
| | | | 711/103 |
| 2011/0016263 A1* | 1/2011 | Lin | G11C 29/02 |
| | | | 711/103 |
| 2011/0233648 A1* | 9/2011 | Seol | H01L 21/32137 |
| | | | 257/324 |
| 2012/0051133 A1* | 3/2012 | Kanda | G11C 16/349 |
| | | | 365/185.11 |
| 2012/0239976 A1* | 9/2012 | Cometti | G11C 16/26 |
| | | | 714/24 |
| 2012/0268994 A1 | 10/2012 | Nagashima | |
| 2012/0294104 A1* | 11/2012 | Mun | G11C 11/56 |
| | | | 365/218 |
| 2013/0173854 A1* | 7/2013 | Shim | G06F 12/0246 |
| | | | 711/103 |
| 2013/0201758 A1 | 8/2013 | Kim et al. | |
| 2014/0136767 A1* | 5/2014 | Lee | G06F 12/0246 |
| | | | 711/103 |

\* cited by examiner

STORAGE DEVICE AND TABLE MANAGEMENT METHOD THEREOF

CROSS-REFERENCE TO RELATED APPLICATIONS

This US non-provisional patent application claims priority under 35 USC §119 to Korean Patent Application No. 10-2014-0030279, filed on Mar. 14, 2014, the entirety of which is hereby incorporated by reference.

BACKGROUND

The present disclosure relates to storage devices and table management methods thereof.

Semiconductor memory devices may be classified as volatile semiconductor memory devices and nonvolatile semiconductor memory devices. Nonvolatile semiconductor memory devices can retain their stored data even when their power supplies are interrupted. Data stored in a nonvolatile memory may be permanent or reprogrammable according to memory manufacturing technology. The nonvolatile semiconductor memory device may be used for storing programs and micro codes in a wide range of applications such as computers, avionics, communication, and consumer electronic technologies.

SUMMARY

The present disclosure relates storage devices and/or table management methods of storage devices.

According to example embodiments of inventive concepts, a table management method of a storage device is provided. The storage device includes at least one nonvolatile memory device and a memory controller configured to control the at least one nonvolatile memory device. Each of the at least one non-volatile memory device includes a plurality of strings on a substrate and coupled between bitlines and a common source line. The plurality of string are arranged perpendicular to the substrate. The table management method may include determining whether a table in one of the at least one nonvolatile memory device needs to be recovered, the table being associated with a page among a plurality of pages in a block of the one of the at least one nonvolatile memory device; performing a block scan operation on the block if the table needs to be recovered; recovering the table using a time difference read from each of the plurality of pages of the block during the block scan operation, the time difference being a time elapsed until a current page among the plurality of pages is programmed from a program time of a previous page among the plurality of pages; and updating the recovered table to the at least one nonvolatile memory device.

In example embodiment, the table may be recovered if the storage device is powered on after being powered off.

In example embodiments, the table may be recovered according to a user's request.

In example embodiments, the table may include a map table and a time table. The map table may be configured to store mapping information between a physical address and a logical address associated with a single page among the plurality of pages in the block. The time table may be configured to store a program time of the single page among the plurality of pages.

In example embodiments, the logical address and the time difference associated with the single page may be stored together in a program operation of the single page.

In example embodiments, the time difference may be calculated by subtracting a current time generated from a timer from the program time of the previous page.

In example embodiments, the block may be a log block, the performing the block scan operation may include determining whether any one of the plurality of pages in the log block is a free page.

In example embodiments, the performing the block scan operation may further include searching a read level of the one page if the one page of the block is not the free page.

In example embodiments, the performing the block scan operation may further include deciding a read level of a next page among the plurality of pages using the searched read level and the time differences read from the one page, and reading the next page based on the decided read level.

In example embodiments, a processing direction of the block scan operation may be opposite a processing direction of a program operation.

According to example embodiments of inventive concepts, a storage device including at least one nonvolatile memory device and a memory controller configured to control the at least one nonvolatile memory device is provided. The at least one nonvolatile memory device may include a plurality of memory blocks on a substrate. Each of the memory blocks may include a plurality of strings coupled between bitlines and a common source line. Each of the memory blocks are configured to store a time difference elapsed from a program time of a logical address and a previous page during a program operation. Each of the memory blocks are configured to store a map table to map the logical address and the physical address and a time table to store a program time of at least one page. The memory controller may include a timer configured to generate current time, and a table manager configured to manage the map table and the time table. The table manager may be configured to update at least one of the map table and the time table through a block scan operation. The memory controller may be configured to determine a read level of a next page in one of the memory blocks using the time difference during the block scan operation.

In example embodiments, the timer may be implemented with software, hardware, or firmware.

In example embodiments, the storage device may be configured to recover the map table and the time table using logical addresses and time differences read through the block scan operation on a log block among the plurality of memory blocks if the storage device is powered off after being powered on.

In example embodiments, the at least one nonvolatile memory device may be configured to store a program time difference of a previous page in one of the memory blocks during a program operation of a current page in the one of the memory blocks.

In example embodiments, the memory controller is configured to calculate a read level using the time table and to perform a read operation on a single page based on the calculated read level.

According to example embodiments of inventive concepts, a table management method of a storage device is provided. The storage device includes at least one nonvolatile memory device and a memory controller configured to control the at least one nonvolatile memory device. Each of the at least one nonvolatile memory device includes a plurality of memory blocks on a substrate. The table management method includes determining whether a table in one of the at least one nonvolatile memory device needs to be recovered, performing a block scan operation on a log block among the plurality of memory blocks in the one of the at least one nonvolatile memory device if the table needs to be recovered, recovering the table using information read from pages 1 to m in the log block, and updating the recovered table to the at least one nonvolatile memory device. The table is associated with the log block and m is an integer greater than 1. The information includes time differences 1 to m stored in the pages 1 to m.

In example embodiments, the performing the block scan operation on the log block may include reading the information from pages 1 to m in a processing direction that is opposite a processing direction of a program operation on the pages 1 to m.

In example embodiments, the memory controller may be configured to program the pages 1 to m in the order of 1 to m. The one of the at least one nonvolatile memory device may be configured to store a logical address and a nth one of the time differences to 1 to m in an nth page among the pages 1 to m during a program operation of the nth page, and n may be an integer greater than 1 and less than or equal to m. The memory controller may be configured to calculate the nth time difference based on a difference between a program time of a (n−1)th page that was programmed before the nth page among the pages 1 to m and a current time generated from a timer in the memory controller.

In example embodiments, the one of the at least one nonvolatile memory device may be configured to store meta data in the table. The meta data may include at least one of (i) mapping information between a physical address and a logical address associated with at least one of the pages 1 to m and (ii) program times of the pages 1 to m. The determining whether the table in the one of the at least one nonvolatile memory device needs to be recovered may include determining the table needs to be recovered if meta data is not updated in the table. The recovering the table may include using the information read from the pages 1 to m to update the meta data in the table.

In example embodiments, each of the plurality of memory blocks may include a plurality of strings on the substrate. Each of the plurality of strings may include a plurality of memory cells stacked on top of each other between at least one ground selection transistor and at least one string selection transistor.

BRIEF DESCRIPTION OF THE DRAWINGS

The foregoing and other features of inventive concepts will be apparent from the more particular description of non-limiting embodiments of inventive concepts, as illustrated in the accompanying drawings in which like reference characters refer to like parts throughout the different views. The drawings are not necessarily to scale, emphasis instead being placed upon illustrating principles of inventive concepts. In the drawings.

DETAILED DESCRIPTION

Figure 1:
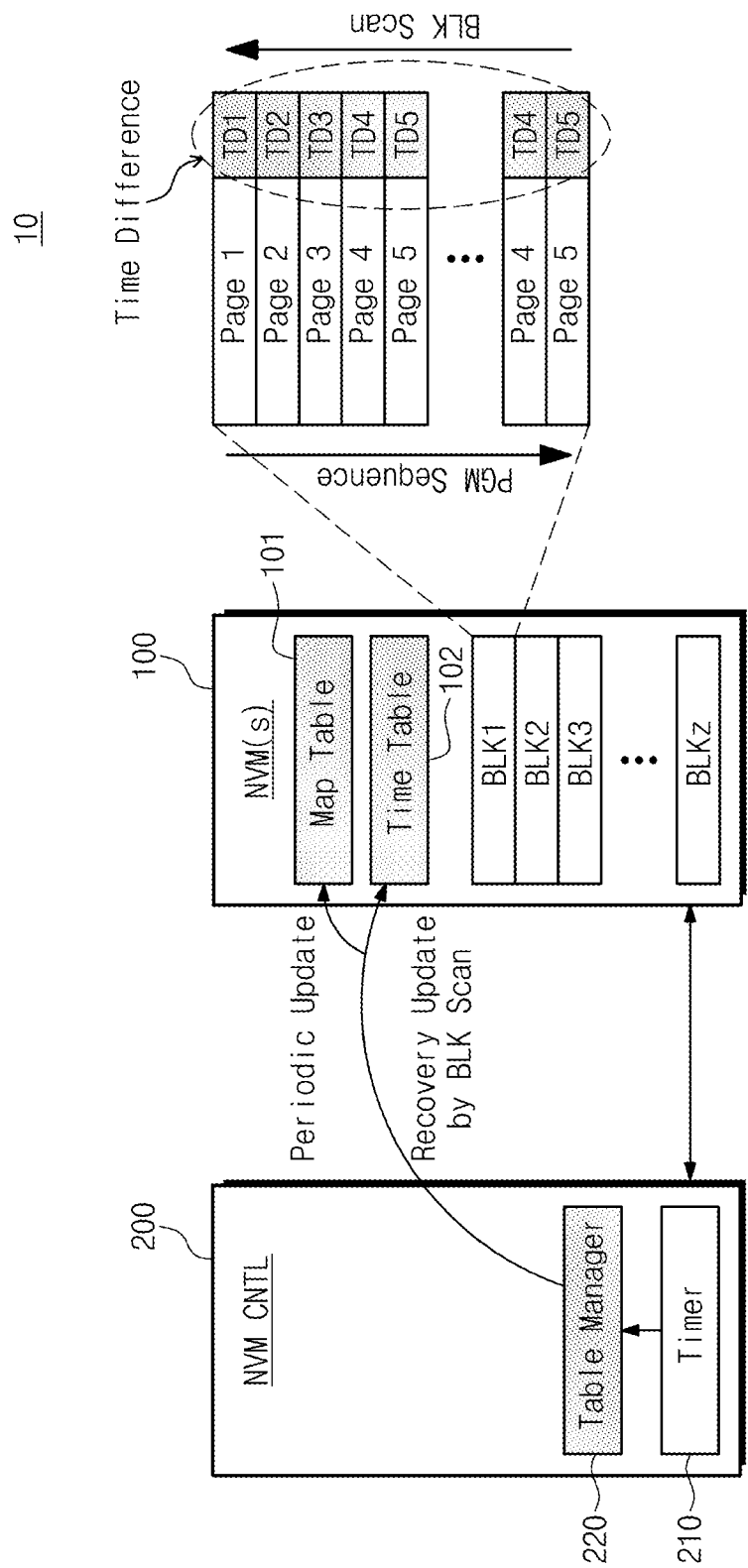
FIG. 1 illustrates a storage device to according to example embodiments of inventive concepts.

Example embodiments will now be described more fully with reference to the accompanying drawings, in which some example embodiments are shown. Example embodiments, may, however, be embodied in many different forms and should not be construed as being limited to the embodiments set forth herein; rather, these example embodiments are provided so that this disclosure will be thorough and complete, and will fully convey the scope of example embodiments of inventive concepts to those of ordinary skill in the art. In the drawings, the thicknesses of layers and regions are exaggerated for clarity. Like reference characters and/or numerals in the drawings denote like elements, and thus their description may be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements or layers should be interpreted in a like fashion (e.g., "between" versus "directly between," "adjacent" versus "directly adjacent," "on" versus "directly on"). As used herein the term "and/or" includes any and all combinations of one or more of the associated listed items.

It will be understood that, although the terms "first", "second", etc. may be used herein to describe various elements, components, regions, layers and/or sections. These elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof. Expressions such as "at least one of," when preceding a list of elements, modify the entire list of elements and do not modify the individual elements of the list.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Although corresponding plan views and/or perspective views of some cross-sectional view(s) may not be shown, the cross-sectional view(s) of device structures illustrated herein provide support for a plurality of device structures that extend along two different directions as would be illustrated in a plan view, and/or in three different directions as would be illustrated in a perspective view. The two different directions may or may not be orthogonal to each other. The three different directions may include a third direction that may be orthogonal to the two different directions. The plurality of device structures may be integrated in a same electronic device. For example, when a device structure (e.g., a memory cell structure or a transistor structure) is illustrated in a cross-sectional view, an electronic device may include a plurality of the device structures (e.g., memory cell structures or transistor structures), as would be illustrated by a plan view of the electronic device. The plurality of device structures may be arranged in an array and/or in a two-dimensional pattern.

FIG. 1 illustrates a storage device 10 according to example embodiments of inventive concepts. As illustrated, the storage device 10 includes at least one nonvolatile memory device 100 and a memory controller 200 to control the nonvolatile memory device 100.

The nonvolatile memory device 100 may be a NAND flash memory, a vertical NAND (VNAND) flash memory, a NOR flash memory, a resistive random access memory (RRAM), a phase-change RAM (PRAM), a magnetoresistive RAM (MRAM), a ferroelectric RAM (FRAM), or a spin-transfer torque RAM (STT-RAM), but example embodiments of inventive concepts are not limited thereto. The nonvolatile memory device 100 may be implemented using a three-dimensional array structure. Example embodiments of inventive concepts may be applied to not only a flash memory device in which a charge storage layer comprises a conductive floating gate but also a charge trap flash (CTF) memory device.

In an embodiment of the present inventive concept, a three dimensional (3D) memory array is provided. The 3D memory array is monolithically formed in one or more physical levels of arrays of memory cells having an active area disposed above a silicon substrate and circuitry associated with the operation of those memory cells, whether such associated circuitry is above or within such substrate. The term "monolithic" means that layers of each level of the array are directly deposited on the layers of each underlying level of the array.

In an embodiment of the present inventive concept, the 3D memory array includes vertical NAND strings that are vertically oriented such that at least one memory cell is located over another memory cell. The at least one memory cell may comprise a charge trap layer. Each vertical NAND string may include at least one select transistor located over memory cells, the at least one select transistor having the same structure with the memory cells and being formed monolithically together with the memory cells.

The following patent documents, which are hereby incorporated by reference, describe suitable configurations for three-dimensional memory arrays, in which the three-dimensional memory array is configured as a plurality of levels, with word lines and/or bit lines shared between levels: U.S. Pat. Nos. 7,679,133; 8,553,466; 8,654,587; 8,559,235; and US Pat. Pub. No. 2011/0233648. Hereinafter, for brevity of description, a non-limiting example is described where the nonvolatile memory device 100 is a vertical NAND (VNAND) flash memory device.

The nonvolatile memory device 100 stores a map table 101 and a time table 102 to manage the storage device 10. The map table 101 stores mapping information associated with a physical address corresponding to a logical address. The time table 102 may include an address of a page where a program operation is performed and program time (absolute time) when a program operation is performed on a corresponding page. During a power-on operation of the storage device 10, the map table 101 and the time table 102 of the nonvolatile memory device 100 may be loaded to a buffer memory, e.g., RAM (not shown) of the memory controller 200.

The nonvolatile memory device 100 includes a plurality of memory blocks BLK1 to BLKz (z being an integer equal to or greater than 2). Each of the memory blocks BLK1 to BLKz includes a plurality of pages, e.g., Page 1 to Page m (m being an integer equal to or greater than 2). Each of programmed pages Page 1 to page m may store a logical address and time differences TD1 to TDm elapsed program time of a programmed previous page.

The memory controller 200 may calculate a time difference elapsed from program time of a previous page using current time and the program time of the previous page read from the time table 102 during a program operation and may control the nonvolatile memory device 100 to store the calculated time difference in a corresponding page. For example, the calculated time difference is stored in a space area of a page to be programmed. That is, the memory controller 200 may calculate a time difference to be stored in the spare area during a program operation.

The memory controller 200 may decide an optimal read level of a page using current time and program time of a page read from the time table 102 and may perform a read operation on a page based on the decided optimal read level.

The memory controller 200 may perform a meta data recovery operation on a log block to perform normal read/write operations on the storage device 10 during power-on following abnormal power-off. The log block is a memory block in which a program operation is preferentially performed and may be at least one of the memory blocks BLK1 to BLKz. Meta data may include information stored in the map table 101 and information stored in the time table 102.

The meta data recovery operation may be performed by a block scan operation on pages Page 1 to Page m of the log block. The block scan operation reads additional information stored in spare areas of the pages Page 1 to Page m. The meta data may be recovered based on the read additional information. For example, the map table 101 may be recovered using logical addresses read from the pages Page 1 to Page m, and the time table 102 may be recovered using time differences TD1 to TDm read from the pages Page 1 to Page m.

In particular, the memory controller 200 includes a timer 210 and a table manager 220. The timer 210 may externally receive time information and count a clock to generate current time. The clock may be input to an external entity (host) or may be internally generated. The timer 210 may be implemented with hardware/software/firmware. In example embodiments of inventive concepts, the timer 210 may count a clock generated from an internal oscillator to generate current time.

The table manager 220 manages updating the map table 101 and/or the time table 102. The table manager 220 may periodically update the map table 101 and the time table 102 during power-up. In example embodiments of inventive concepts, the table manager 220 may non-periodically update the map table 101 and/or the time table 102 according to a user's request or an internal determination when power-off is predicted in spite of a power-on state.

The table manager 220 may perform a block scan operation in association with a log block (e.g., BLK1) in which meta data is not updated during power-on following power-off and may recover the map table 101 and/or the time table 102. In particular, an optimal read level of the next gate (or page) may be decided at high speed by using read time of any one page during the block scan operation to significantly reduce block scan operation time.

The table manager 220 may calculate program time of each of the pages Page 1 to Page m by using time differences TD1 to TDm of the pages Page 1 to Page m and program time of a previous page and may update an address of a page corresponding to the calculated program time to the time table 102.

In example embodiments of inventive concepts, the table manager 220 may be implemented with hardware/software/firmware.

In example embodiments of inventive concepts, the block scan operation order on the pages Page 1 to Page m may be exactly opposite to the program operation order. However, example embodiments of inventive concepts are not limited thereto. The block scan operation order on the pages Page 1 to Page m may be identical to the program operation order.

A typical storage device performs recovery update on meta data of a log block, where power-off occurs, through a block scan operation while the meta data is not updated. However, since a plurality of scan read operations are performed to search an optimal read level of each page during a typical block scan operation, relatively long time is required.

As compared to a conventional storage device, the storage device 10 according to example embodiments of inventive concepts may recover meta data easily and rapidly using program time differences TD1 to TDm elapsed from a program time of a previous page during a block scan operation.

In particular, the storage device 10 may significantly reduce block scan operation time as compared to a conventional storage device. A typical block scan operation must perform a plurality of scan read operations on respective pages to search a read level. However, according to example embodiments of inventive concepts, if a plurality of scan read operations are performed on a programmed first page following a free page to search only a read level, an optical read level may be predicted from the next page using a read time difference to perform a block scan operation while omitting the plurality of scan read operations.

Figure 2:
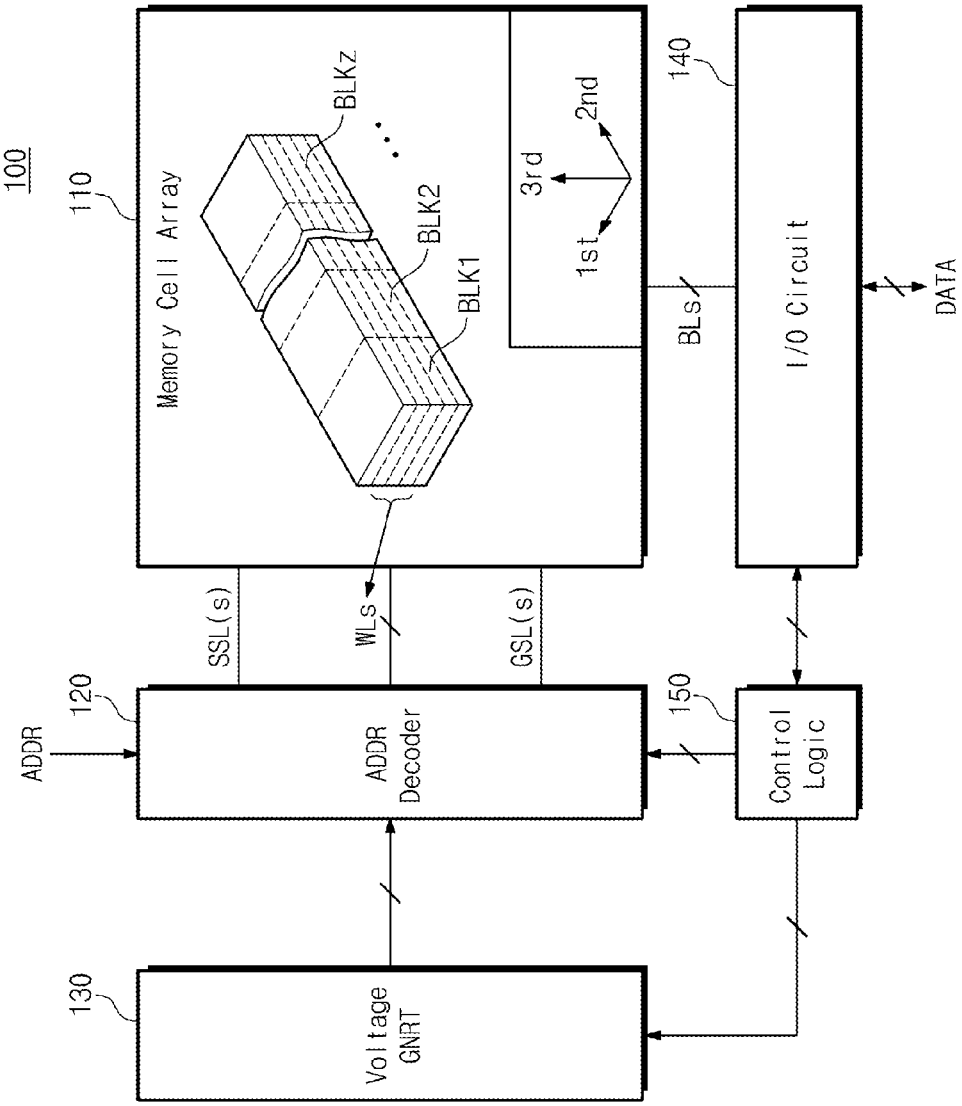
FIG. 2 illustrates a nonvolatile memory device according to example embodiments of inventive concepts.

FIG. 2 illustrates a nonvolatile memory device 100 according to example embodiments of inventive concepts. As illustrated, the nonvolatile memory device 100 includes a memory cell array 110, an address decoder 120, a voltage generation circuit 130, an input/output circuit 140, and a control logic 150.

The memory cell array 110 includes a plurality of memory blocks BLK1 to BLKz (z being an integer equal to or greater than 2). Each of the memory blocks BLK1 to BLKz is connected to the address decoder 120 through wordlines WLs, at least one string selection line SSL, and at least one ground selection line GSL and is connected to the I/O circuit 140 through bitlines BLs. In example embodiments of inventive concepts, the wordlines WLs may be implemented in the form of stacked plates.

Each of the memory blocks BLK1 to BLKz includes a plurality of three-dimensional strings arranged in a first direction and a second direction (differing from the first direction) on a substrate and arranged in a third direction (perpendicular to a plane formed in the first direction and the second direction). Each of the strings includes at least one selection transistor, a plurality of memory cells, and at least one ground selection transistor which are coupled in series between a bitline and a common source line CSL. Each of the memory cells may store at least one bit. In example embodiments of inventive concepts, at least one dummy cell may be included between at least one string selection transistor and a plurality of memory cells and/or at least one dummy cell may be included between a plurality of memory cells and at least one ground selection transistor.

The address decoder 120 may select one of the memory blocks BLK1 to BLKz in response to an address. The address decoder 120 is connected to the memory cell array through wordlines WLs, at least one string selection line SSL, and at least one ground selection line GSL. The address decoder 120 selects the wordlines WLs, the string selection line SSL, and the ground selection line GSL using a decoded row address. The address decoder 120 may decode a column address among input addresses. The decoded column address may be transferred to the I/O circuit 140. In example embodiments of inventive concepts, the address decoder 120 may include a row decoder, a column decoder, an address buffer, and the like.

The voltage generation circuit 130 may generate voltages for driving the memory cell array 110 (e.g., a program voltage, a pass voltage, a read voltage, a read/pass voltage, a verify voltage, an erase voltage, a common source line voltage, a well voltage, etc.). The voltage generation circuit 130 may generate a wordline voltage Vwl for program/read/erase operations.

The voltage generation circuit 130 may selectively generate a wordline voltage having an offset pulse according to the control of the control logic 150. That is, the voltage generation circuit 130 may generate a wordline voltage having an offset pulse or a wordline voltage Vwl having no offset pulse.

The I/O circuit 140 is connected to the memory cell array 110 through bitlines BLs. The I/O circuit 140 may be implemented to receive the decoded column address from the address decoder 120. The I/O circuit 130 may select the bitlines BLs using the decoded column address.

The I/O circuit 140 may include a plurality of page buffers to store data to be programmed during a program operation or to store read data during a read operation. Each of the page buffers may include a plurality of latches. During a program operation, data stored in the page buffers may be programmed into a page corresponding to a selected memory block through bitlines BLs. During a read operation, data read from the page corresponding to the selected memory block may be stored in page buffers through the bitlines BLs. The I/O circuit 140 may read data from a first region of the memory cell array 110 and store the read data in a second region of the memory cell array 110. For example, the I/O circuit 140 may be implemented to perform a copyback operation.

The control logic 150 controls the overall operation (program/read/erase operations, etc.) of the nonvolatile memory device 100. The control logic 150 may operate in response to externally input control signals or command. The control logic 150 controls the address decoder 120, the voltage generation circuit 130, and the I/O circuit 130 during program/read/erase operations.

The control logic 150 may be implemented to perform an optimal read operation for a page during a read operation or a scan operation, based on information on the optimal read level inputted to the memory controller 200 (see FIG. 1). The optimal read level may be calculated based on current time and program time stored in the time table 102, as explained with reference to FIG. 1.

The nonvolatile memory device 100 may perform a scan read operation based on an externally provided optimal read level to significantly reduce open time. The open time includes the time used for recovering meta data of a state prior to power-off such that the nonvolatile memory device 100 is made readable/programmable.

Figure 3:
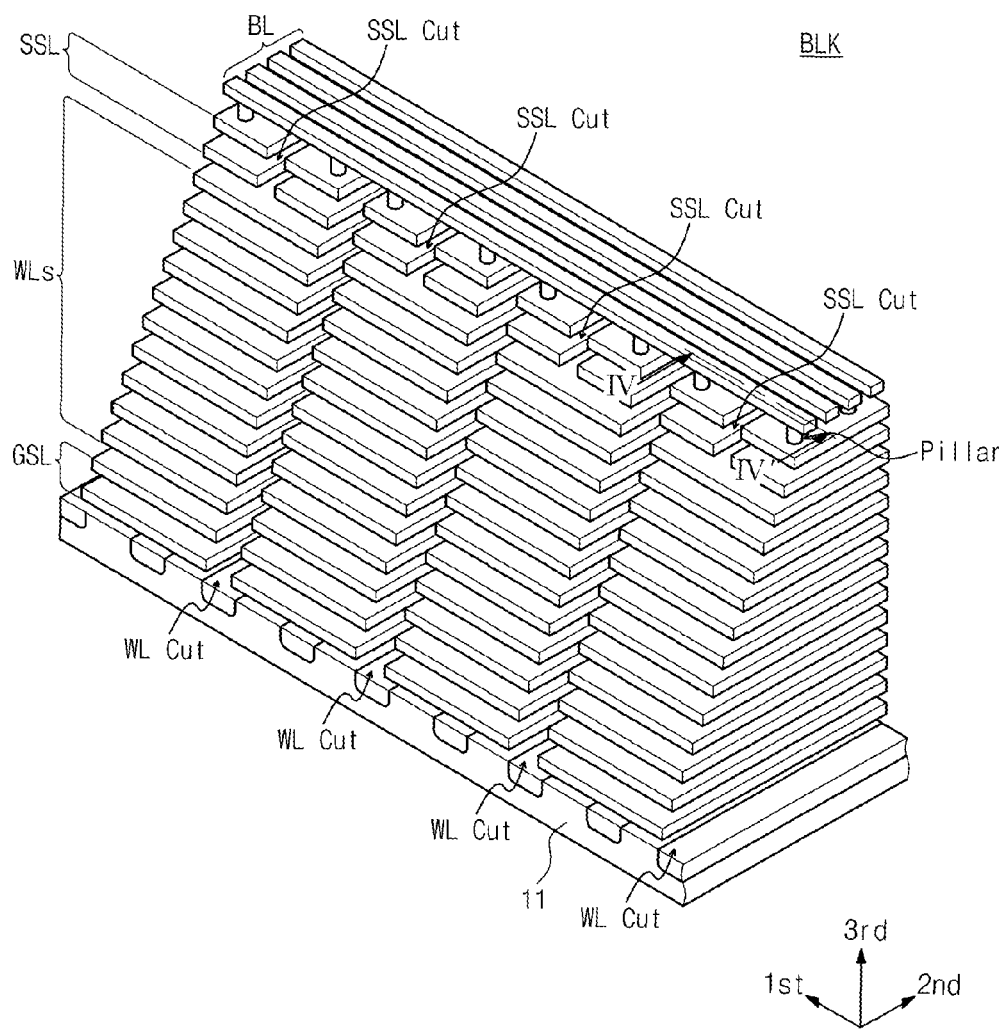
FIG. 3 illustrates a memory block in FIG. 2.

FIG. 3 illustrates a memory block BLK in FIG. 2. Referring to FIG. 3, four sub-blocks are formed on a substrate 111. Each of the sub-blocks is formed by stacking at least one ground selection line GSL, a plurality of wordlines WLs, and at least one string selection line SSL in the form of a plate between wordline cuts on the substrate 111. The at least one string selection line SSL is divided into string selection line cuts. A wall-shaped common source line CSL may be formed inside each wordline cut.

In example embodiments of inventive concepts, at least one dummy wordline may be stacked in the form of a plate between a ground selection line GSL and wordlines WLs or at least one dummy wordline may be stacked in the form of a plate between wordlines WLs and a string selection line SSL.

Although not shown in this figure, each wordline cut includes a common source line CSL. In example embodiments of inventive concepts, a common source line included in each wordline cut is commonly connected. A pillar connected to a bitline penetrates at least one ground selection line GSL, a plurality of wordlines WLs, and at least one string selection line SSL to form a string.

As shown in FIG. 3, a target between wordline cuts is a sub-block. However, example embodiments of inventive concepts are not limited thereto. In example embodiments of inventive concepts, a target between a wordline cut and a string selection line cut may be named a sub-block.

A block BLK according to example embodiments of inventive concepts may be implemented using a structure in which two wordlines are merged into one, e.g., a merged wordline structure.

Figure 4:
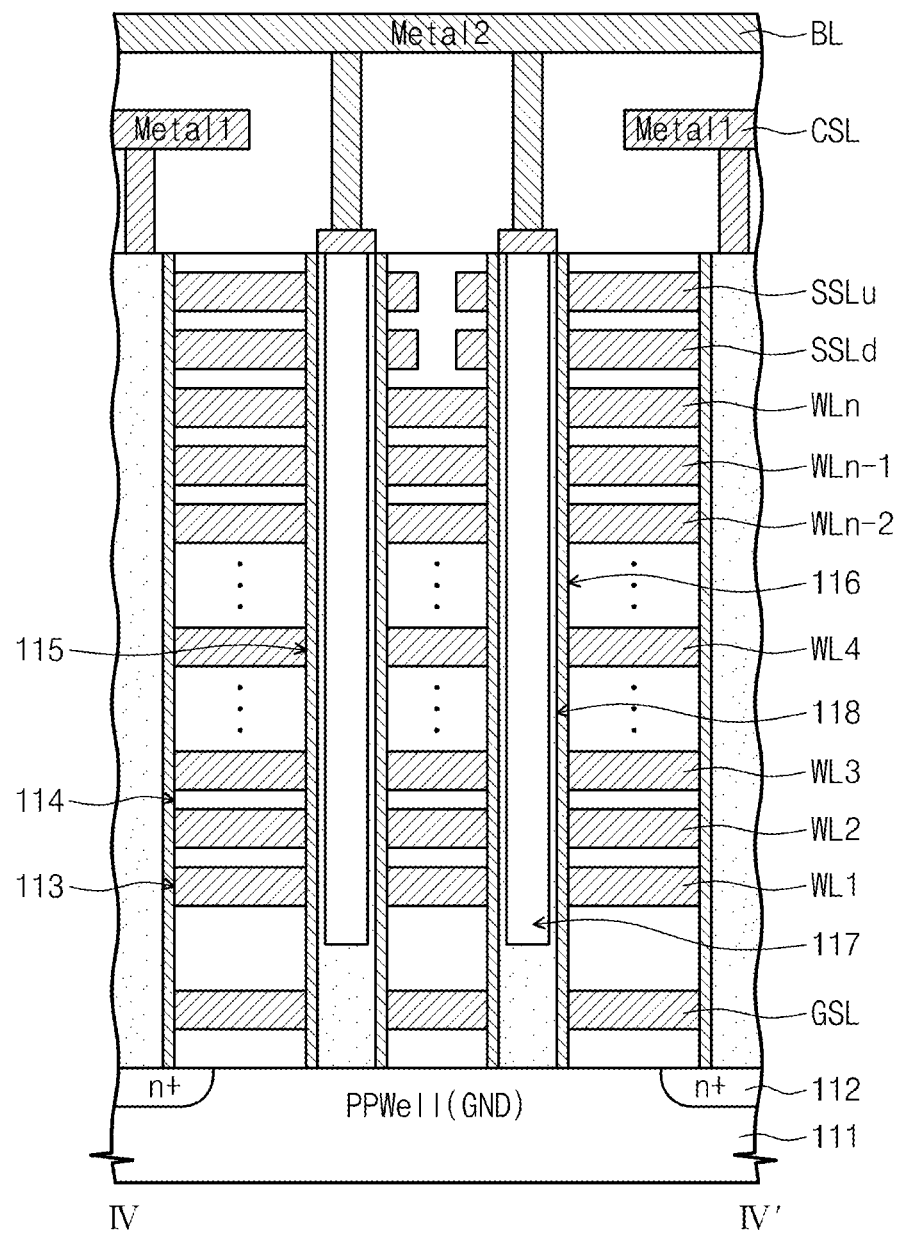
FIG. 4 illustrates a portion of a cross-sectional view of a memory block in FIG. 3, taken along line IV-IV'.

FIG. 4 illustrates a portion of a cross-sectional view of the memory block BLK in FIG. 3, taken along line IV-IV'. As illustrated, the memory block BLK is formed in a direction perpendicular to the substrate 111. An n+ doped region 112 is formed on the substrate 111.

Gate electrode layers 113 and insulating layers 114 are alternately deposited on the substrate 111. In example embodiments of inventive concepts, an information storage layer 115 may be formed on side surfaces of the gate electrode layers 113 and the insulating layers 114.

The gate electrode layer 113 may be connected to a ground selection line GSL, a plurality of wordlines WL1 to WL8, and a string selection line SSL.

The information storage layer 115 may include a tunnel insulating layer, a charge storage layer, and a block insulating layer. The tunnel insulating layer may act as an insulating layer in which charges may travel due to tunneling effect. The charge storage layer may include an insulating layer to trap charges. The charge storage layer may be made of, for example, nitride (SiN) or metal oxide (aluminum oxide or hafnium oxide). The blocking insulating layer may act as an insulating layer between the gate electrode layer and the charge storage layer. The blocking insulating layer may be made of silicon oxide. The tunnel insulating layer, the charge storage layer, and the blocking insulating layer may be made of an insulating layer having an oxide-nitride-oxide (ONO) structure. However, example embodiments of inventive concepts are not limited thereto.

A pillar 116 may be formed by vertically patterning the gate electrode layer 113 and the insulating layer 114.

The pillar 116 is coupled between a bitline and the substrate 111 through the gate electrode layer 113 and the insulating layer 114. The inside of the pillar 116 may be a filling dielectric pattern 117 which is made of an insulating material such as silicon oxide or an air gap. The outside of the pillar 116 may be a vertical active pattern 118 which includes a channel semiconductor. In example embodiments of inventive concepts, the vertical active pattern 118 may be made of p-type silicon. A certain single memory cell included in a string may include a charge dielectric pattern 117, a vertical active pattern 118, the charge storage layer 115, and the gate electrode layer 113 that are sequentially disposed from the inside of the pillar 116.

Common source lines CSL extend on the n+ doped regions 112. The common source line CSL may be included inside a wordline cut in the form of a well.

Figure 5:
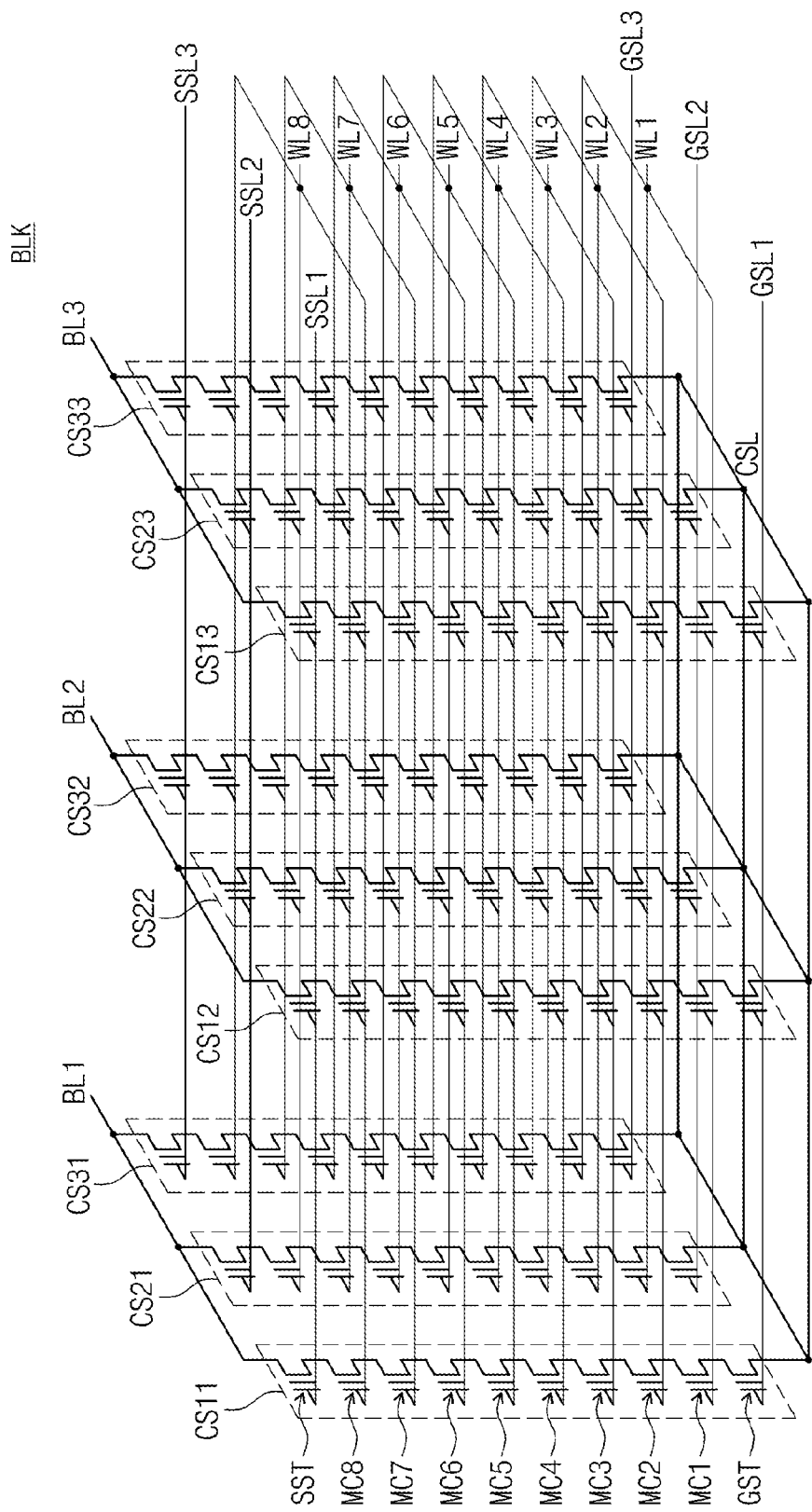
FIG. 5 illustrates an equivalent circuit diagram of the memory block in FIG. 3.

FIG. 5 is an equivalent circuit diagram of the memory block BLK in FIG. 2 according to example embodiments of inventive concepts. As illustrated, cell strings CS11 to CS33 are coupled between bitlines BL1 to BL3 and a common source line CSL. Each of the cell strings (e.g., CS11) may include a ground selection transistor GST, a plurality of memory cells MC1 to MC8, and a string selection transistor SST. For the convenience of description, let it be assumed that the number of memory cells included in a string is eight. However, the number of memory cells included in a string according to example embodiments of inventive concepts are not limited thereto.

The string selection transistor SST is connected to a string selection line SSL. The string selection line SSL may be divided into first to third string selection lines SSL1 to SSL3. In FIG. 5, three string selection lines SSL1 to SSL3 are shown connected to string selection transistors SSTs that are connected to a single bitline. However, example embodiments of inventive concepts are not limited thereto. For example, in example embodiments, a bit line (e.g., BL1) may be connected to more than three cell strings (e.g., CS11, CS21, CS31, and a fourth cell string not shown). In which case, a fourth string selection may be connected to the string selection transistor of the fourth cell string. Also, in example embodiments, each cell string may be include more than one string selection transistor on the memory cells and/or more than one ground selection transistor below the memory cells. If a cell string includes more than one string selection transistor, each string selection transistor may be connected to a different string selection line. If a cell string includes more than one ground selection transistor, each ground selection transistor may be connected to a different ground selection line. Each string selection line may be connected to two or more string selection transistors at the same height from cell strings that are connected to different bit lines. Each ground selection line may be connected to two or more ground selection transistors at the same height from cell strings that are connected to different bit lines. However, the string selection transistors at the same height among cell strings that are connected to a same bit line (e.g., CS11 and CS21 connected to BL1) may be connected to different string selection lines (e.g., SSL1 and SSL2). Similarly, the ground selection transistors at the same height among cell strings that are connected to a same bit line (e.g., CS11 and CS21 connected to BL1) may be connected to different ground selection lines (e.g., GSL1 and GSL2).

The ground selection transistor GST is connected to a ground selection line GSL. Ground selection lines GSL of respective cell strings are connected. The ground selection line GSL is divided into first to third ground selection lines GSL1 to GSL3. In FIG. 5, three ground selection lines GSL1 to GSL3 corresponding to a single bitline are shown. However, example embodiments of inventive concepts are not limited thereto. The memory block BLK may include at least two ground selection lines corresponding to a single bitline. The ground selection lines GSL1 to GSL3 may be electrically connected to each other.

The string selection transistor SST is connected to a bitline BL, and the ground GST is connected to a common source line GSL.

The memory cells MC1 to MC8 may be connected to corresponding wordlines WL1 to WL8, respectively. A set of memory cells connected to a single wordline and programmed at the same time is referred to as a page. A memory block BLK1 includes a plurality of pages. A plurality of pages may be connected to a single wordline. Referring to FIG. 4, a wordline (e.g., WL4) is commonly connected to three pages from the common source line CSL.

Each memory cell may store one a single bit of data or two or more bits of data. A memory cell for storing a single bit of data is referred to as a single-level cell (SLC) or a single-bit cell. A memory cell for storing two or more bits of data is referred to as a multi-level cell (MLC) or a multi-bit cell.

On the other hand, the nonvolatile memory device 100 may be implemented using a charge trap flash (CTF) memory device. In this case, charges trapped to a programmed CTF memory device may be redistributed and lost, e.g., initial verify shift (WS) may occur with the lapse of time. A reprogramming operation may be performed to overcome such distribution degradation.

Figure 6:
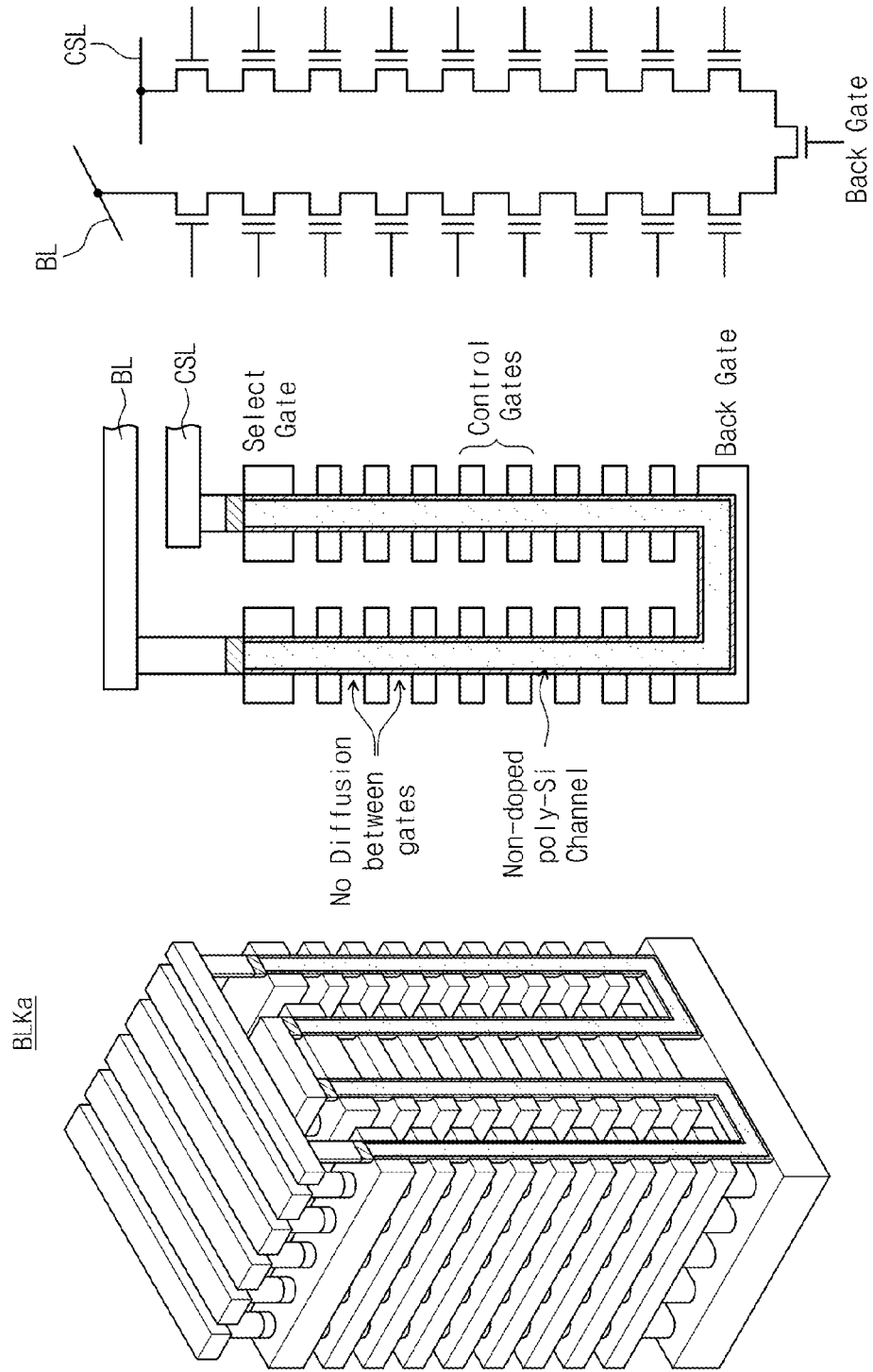
FIG. 6 illustrates a memory block according to example embodiments of inventive concepts.

FIG. 6 illustrates a memory block according to example embodiments of inventive concepts. Referring to FIG. 6, a string may be disposed between a bitline BL and a common source line CSL and may include first memory cells disposed in a vertical direction between the bitline BL and a substrate and second memory cells disposed in a vertical direction between the substrate and the common source line CSL.

In example embodiments of inventive concepts, a memory block BLKa may be implemented using a P-BiCS structure.

Figure 7:
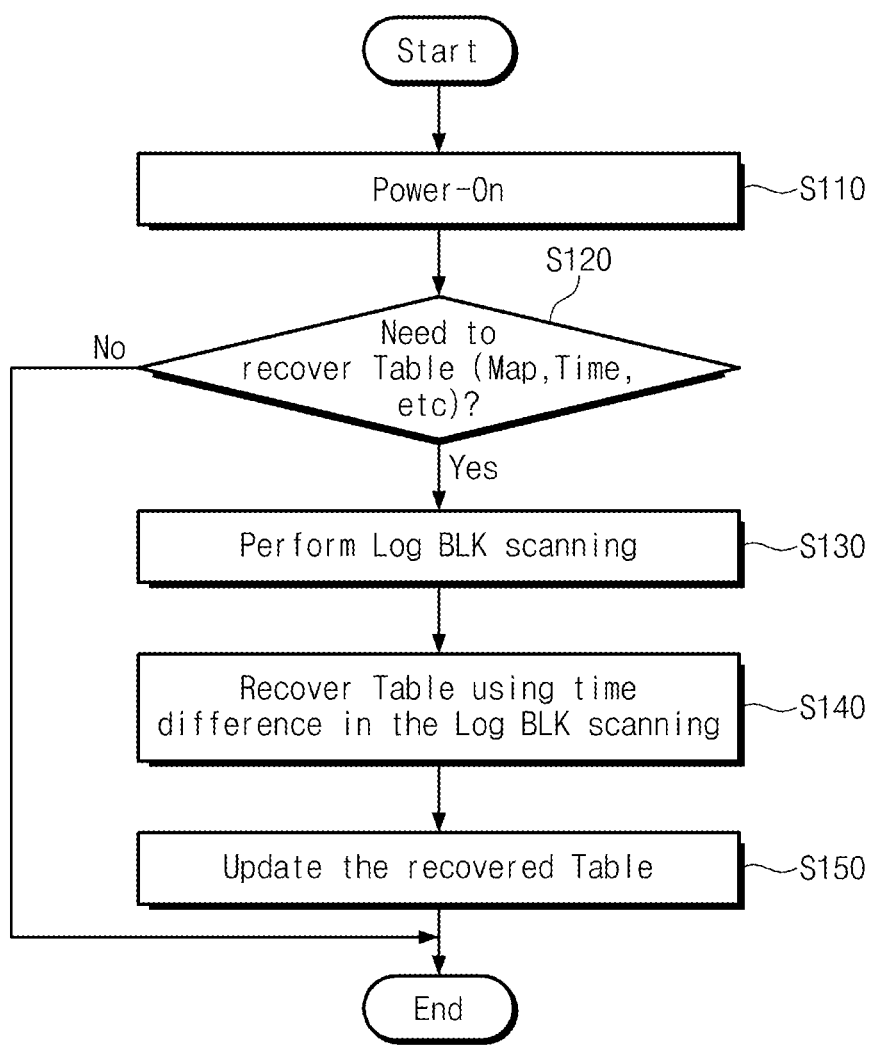
FIG. 7 is a flowchart summarizing a table management method of a storage device according to example embodiments of inventive concepts.

FIG. 7 is a flowchart summarizing a table management method of a storage device according to example embodiments of inventive concepts. Referring to FIGS. 1 to 7, the storage device 100 enters a power-on state from a power-off state (S110). The table manager 220 determines whether a table needs to be recovered. For example, when a block scan operation is required (and/or desired) (e.g., there is a log block where meta data is not updated), the table needs to be recovered (S120). The table management method may omit the step of determining whether the table needs to be recovered (S120). That is, when the storage device 100 enters a power-on state after a power-off state, a table recovery operation may be performed in default.

When the table needs to be recovered, a block scan operation is performed on the log block (S130). The table manager 220 may recover meta data on the log block through the block scan operation. For example, a map table for a physical address and a logical address of each page and program time of each page may be recovered. In particular, the table manager 220 may calculate program times of pages of the log block using read program time differences TD1 to TDm and program time of a previous page through the block scan operation on the log block and may recover a time table prior to power-off using the calculated program times (S140). The recovered time table is updated (S150). In the meantime, when the table does not need to be recovered, a table recovery update operation is completed.

According to the above-described table management method, a time table may be recovered using read program time differences TD1 to TDm through a scan operation of a log block.

Figure 8:
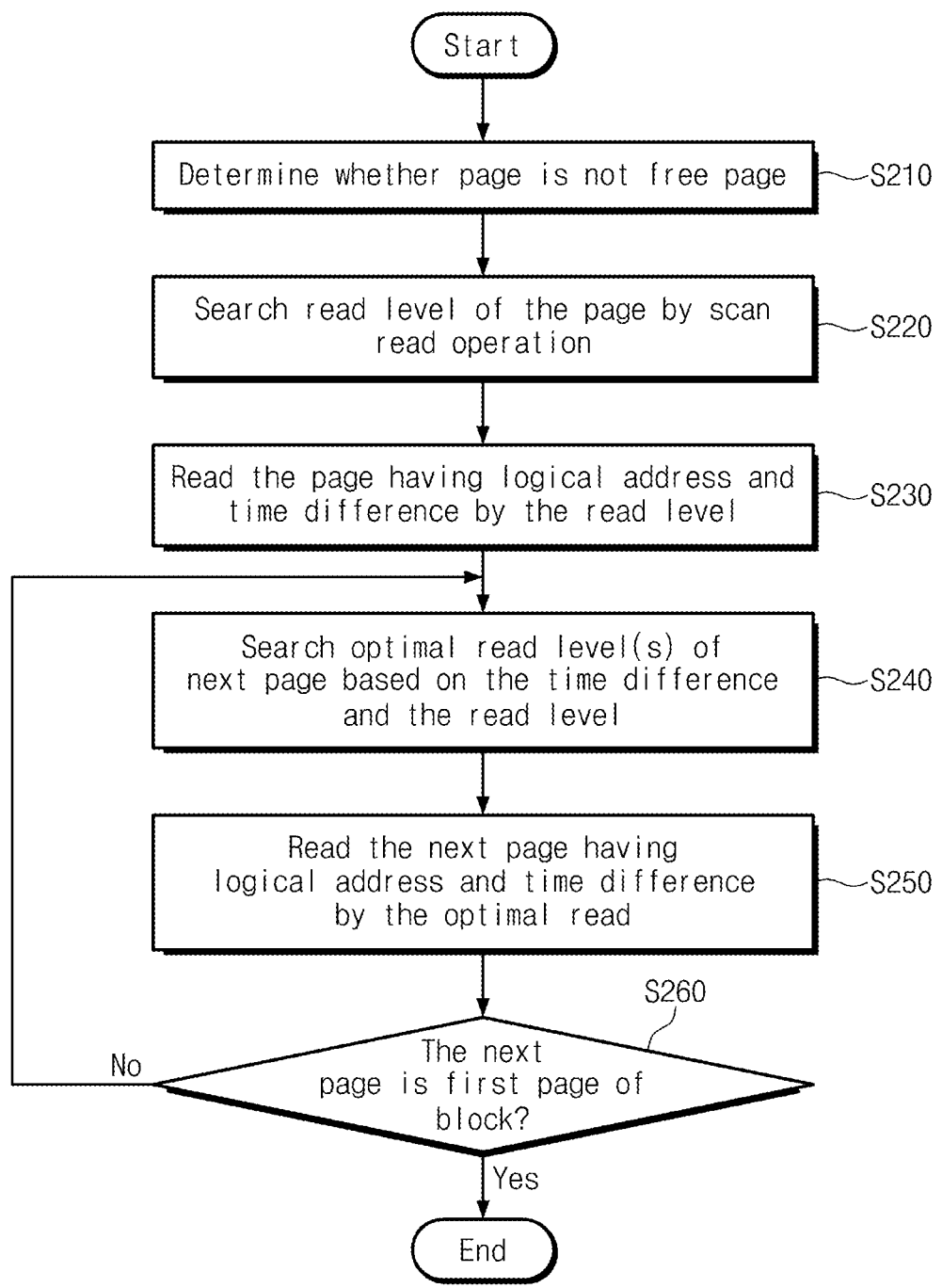
FIG. 8 is a flowchart summarizing a block scan operating method of a storage device according to example embodiments of inventive concepts.

FIG. 8 is a flowchart summarizing a block scan operating method of a storage device according to example embodiments of inventive concepts. Referring to FIGS. 1 to 8, a block scan operation will be described below.

Determination is made as to whether from the last page, pages of a log block are sequentially free pages. As shown in FIG. 1, the order of a block scan operation may be inverse to the order of a program operation (S210). When a page is not a free page, a read level is searched by performing a plurality of scan read operations on a corresponding page (S220). A read operation is performed on the searched read level. As a result, a logical address of the page and a time difference may be known. The time difference is time elapsed from program time of a pre-programmed page (S230). Optimal read level(s) of the next page is searched based on the read time difference and the read level. In this case, a relationship between the read level and the time difference is considered to be known (S240). The next page is read by the optimal read level. Thus, a logical address and a time difference corresponding to the next page may be read (S250). Determination is made as to whether the next page is a first page of a memory block to perform a block scan operation (S260). When the next page is not the first page, the step S240 is performed on the next page. When the next page is the first page, the block scan operation is completed.

Logical addresses and time difference may be read through the block scan operation, and a map table and a time table may be recovered based on the read logical addresses and the read time differences.

According to the above-described block scan operation, an optimal read level of the next page may be searched using a time difference read from any one page to achieve a high-speed scan operation.

Figure 9:
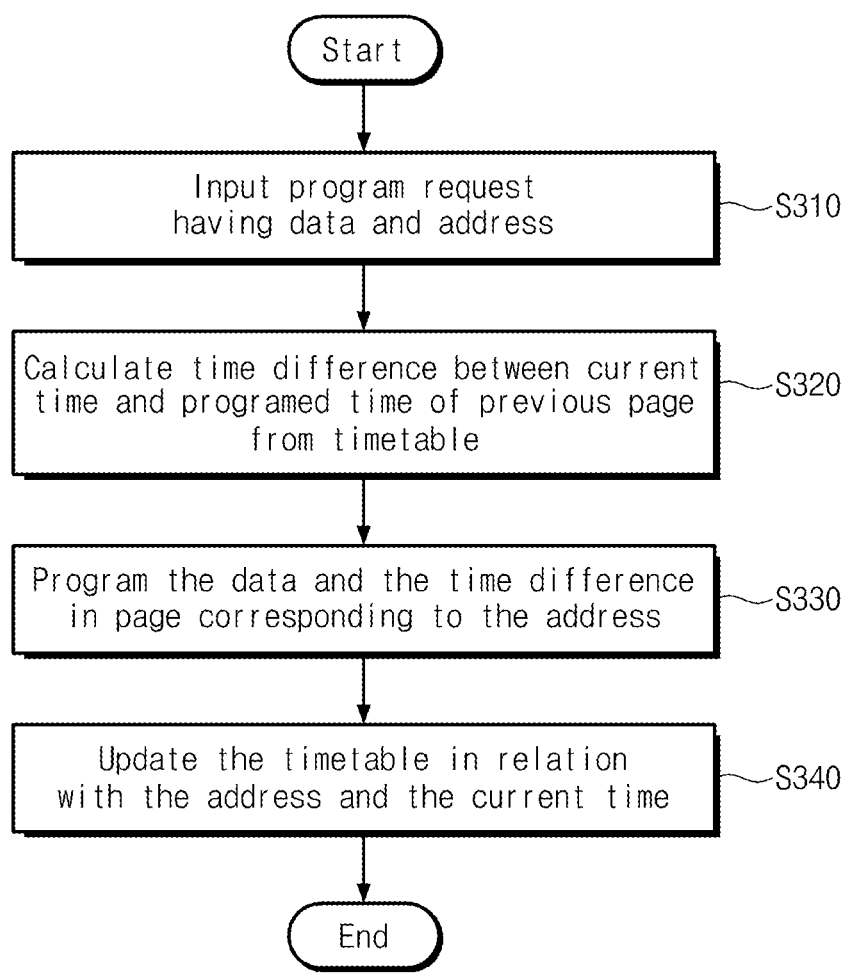
FIG. 9 is a flowchart summarizing a program method of a storage device according to example embodiments of inventive concepts.

FIG. 9 is a flowchart summarizing a program method of a storage device according to example embodiments of inventive concepts. Referring to FIGS. 1 to 9, a program request having data and an address is externally input (S310). A program time difference between current time generated from the timer 210 and program time of a previous page from the time table 102 is calculated (S320). Data and the program time difference are programmed into a page corresponding to a page (S330). A time table associated with the address and the current time is updated (S340). In this case, the time table may be periodically updated as shown in FIG. 1 or may be non-periodically updated. In some cases, the time table may be recovered and updated.

According to the above-described program method, a program time difference elapsed from program time of a previous page may be stored during a program operation.

Figure 10:
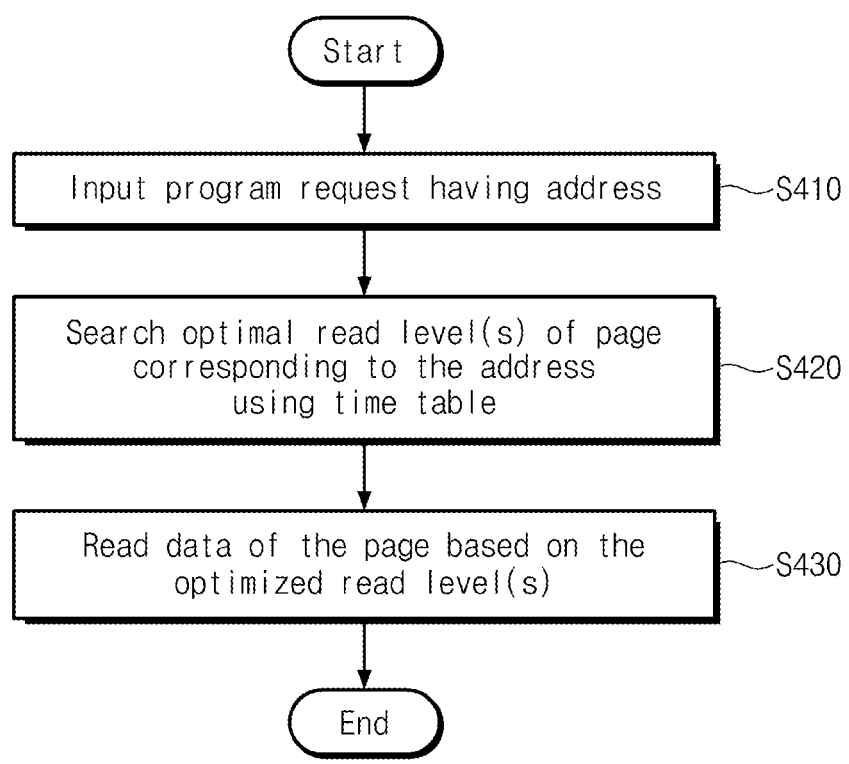
FIG. 10 is a flowchart summarizing a read method of a storage device according to example embodiments of inventive concepts.

FIG. 10 is a flowchart summarizing a read method of a storage device according to example embodiments of inventive concepts. Referring to FIGS. 1 and 10, a read request having an address is externally input (S410). Optimal read level(s) of a page corresponding to an address is searched from the time table 102 (S420). Data of the page is read based on the optimal read level(s) (S430).

According to the above-described read method, an optimal read level may be searched using a time table and an optimal read operation may be performed based on the searched optimal read level.

Figure 11:
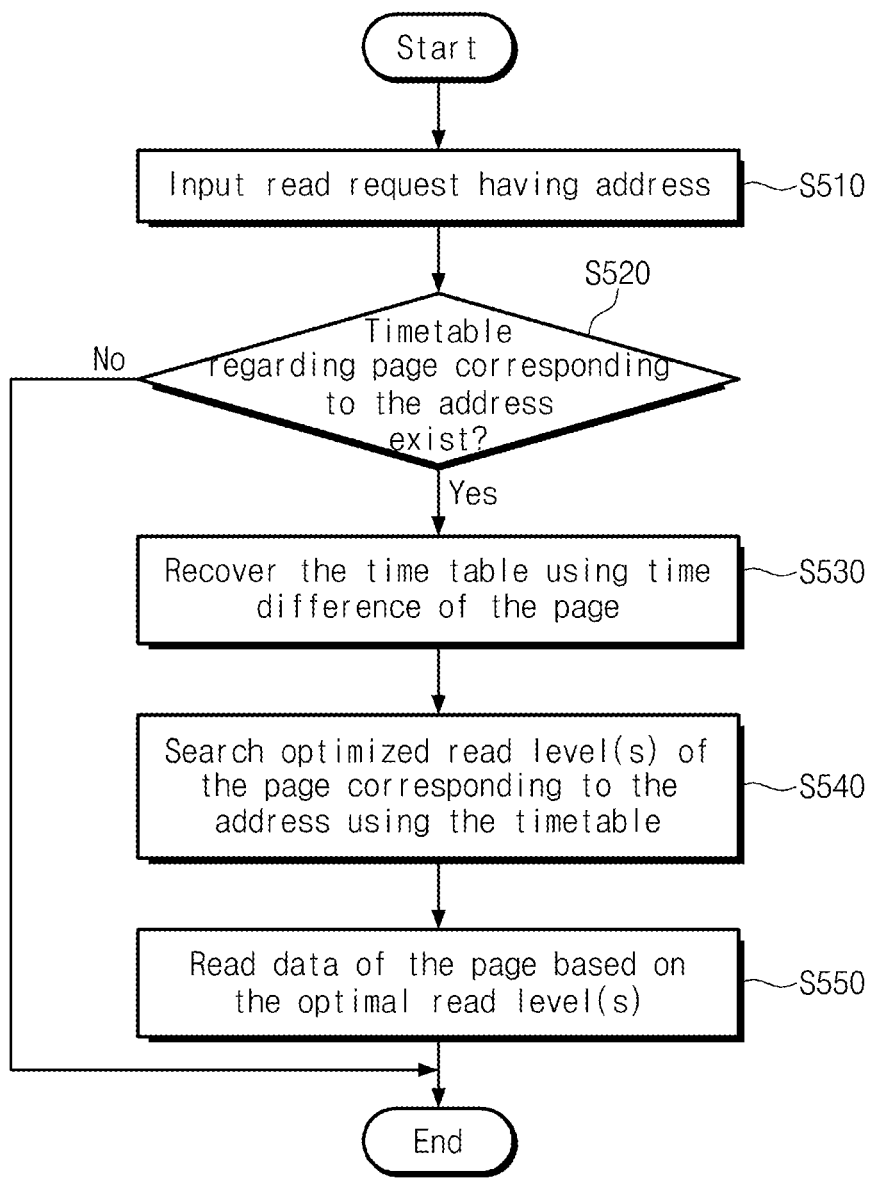
FIG. 11 is a flowchart summarizing a read method of a storage device according to example embodiments of inventive concepts.

The above-described read method may further include a time table recovery operation. FIG. 11 is a flowchart summarizing a read method of a storage device according to example embodiments of inventive concepts. Referring to FIGS. 1 to 11, a read request having an address is externally input (S510). Determination is made as to whether there is a time table for a page corresponding to an address (S520). When there is no time table for a page, the time table is recovered using a program time difference stored in the page (S530). Optimal read level(s) of a page corresponding to an address is searched from the time table 102 (S540). When there is a time table for a page corresponding to an address, the flow proceeds to S540. Data of the page is read based on the optimal read level(s) (S550).

According to the above-described read method, a time table is recovered during a read operation of a page having no time table and a read operation may be performed based on the recovered time table.

Figure 12:
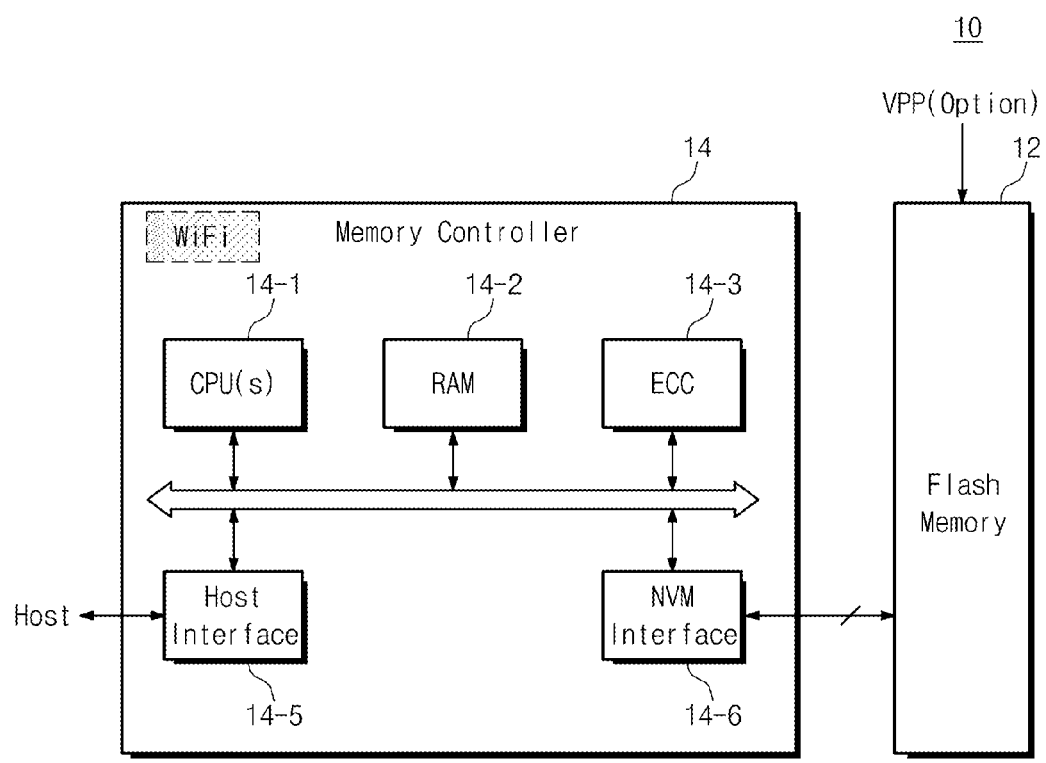
FIG. 12 is a block diagram of a storage device according to example embodiments of inventive concepts.

FIG. 12 is a block diagram of a storage device 10 according to example embodiments of inventive concepts. As illustrated, the storage device 10 includes at least one nonvolatile memory device 12 and a memory controller 14 to control the nonvolatile memory device 12. The storage device 10 may be a storage medium such as a memory card (e.g., CF, SD, microSD, etc.) and a USB storage device.

The nonvolatile memory device 12 may be implemented using the nonvolatile memory device 100 shown in FIG. 1. The memory controller 14 may be implemented using the memory controller 200 shown in FIG. 1. The memory controller 14 may revise a time table corresponding to at least one environmental information such as the number of program loops, an operation mode, pass/failure information of a specific program state, state information, temperature information, a program/erase (P/E) cycle, information associated with a physical structure of a wordline, information associated with a physical position of a wordline, position information, address information, selected/unselected information, and time information. In addition, the memory controller 14 may search an optimal read level using the revised time table and perform an optimal read operation on the nonvolatile memory device 10 based on the searched optimal read level.

The memory controller 14 controls read, write, and erase operation of the nonvolatile memory device 12 in response to a host request. The memory controller 14 includes at least one central processing unit (CPU) 14-1, a random access memory (RAM) 14-2, an error correction code (ECC) circuit 14-3, a host interface 14-5, and a nonvolatile memory (NVM) interface 14-6.

The CPU 14-1 may control the overall operation (e.g., read, write, file system management, bad page management, etc.) of the nonvolatile memory device 12. The RAM 14-2 operates according to control of the CPU 14-1 and may be used as a work memory, a buffer memory, and/or a cache memory. When the RAM 14-2 is used as a work memory, data processed by the CPU 14-1 is temporarily stored. When the RAM 14-2 is used as a buffer memory, it buffers data to be transferred from a host to the nonvolatile memory device and/or transferred from the nonvolatile memory device 12 to the host. When the RAM 14-2 is used as a cache memory, it enables a low-speed nonvolatile memory device 12 to operate at high speed. The CPU may be a hardware processor.

The ECC circuit 14-3 generates an error correction code (ECC) to correct a fail bit or an error bit of data received from the nonvolatile memory device 12. The ECC circuit 14-3 performs error correction encoding on data provided to the nonvolatile memory device 12 to generate data to which a parity bit is added. The parity bit may be stored in the nonvolatile memory device 12. The ECC circuit 14-3 may perform error correction decoding on data output from the nonvolatile memory device 12. The ECC circuit 14-3 may correct an error using a parity. The ECC circuit 14-3 may correct an error using coded modulation such as low density parity check (LDPC) code, BCH code, turbo code, Reed-Solomon code, convolution code, recursive systematic code (RSC), trellis-coded modulation (TCM), block coded modulation (BCM).

The memory controller 14 exchanges data with a host via the host interface 14-5 and exchanges data with the nonvolatile memory device 12 via the NVM interface 14-6. The host interface 14-5 may be connected to the host via a parallel AT attachment bus (PATA), a serial AT attachment bus (SATA), SCSI, USB, PCIe, a NAND interface.

In example embodiments of inventive concepts, the memory controller 14 may accommodate a wireless communication function (e.g., WiFi).

The storage device 10 may manage a program timestamp table at a flash translation layer (FTL) in consideration of IVS characteristics. Time for scanning a log block may be optimized, and a program timestamp table may be recovered for a short time. A read level of a page corresponding to open time must be recovered with respect to a log block where power-off occurs while the power-off is not reflected on the program timestamp table, and a corresponding page may be read to a single read level among run times that must be reflected on the program timestamp table. However, when a page of the log block is scanned, time is used for searching a read level of corresponding pages to increase the open time. Thus, the storage device 10 may reduce log block scan time and may easily recover the program timestamp table.

The storage device 10 must manage a time table at the FTL to manage an IVS issue after being programmed into the VNAND flash memory. The time table cannot always be programmed into the VNAND flash memory. For this reason, the time table must be programmed into the NAND in each specific period. In addition, when power-on or power-off occurs, a practically data-programmed page must be read with respect to table update content that is not programmed into the VNAND flash memory and it is necessary to infer how long time passes. That is, the degree of distribution shift must be understood using the read level and each page must try to be read N times. Thus, log block scan time increases.

The storage device 10 writes a time difference with programmed data into a spare area before a point of writing data. The storage device 10 may search a read level at one time by back tracking programmed time of a previous page in the read level during log block scanning, based on the time difference.

More specifically, a read level of a first page following a free page is searched during log block scanning. However, from the next page, the read level may be read by applying a corresponding time gap because there is a programmed time difference in a spare area of a just read page.

In a method of driving a storage device according to example embodiments of inventive concepts, a time difference with a previous page is written when a page is programmed. In example embodiments of inventive concepts, the time difference may be used to search a read level during log block scanning. In example embodiments of inventive concepts, the time difference may be used to cover an WS table.

A storage device according to example embodiments of inventive concepts stores a time difference in a spare area of a page. However, example embodiments of inventive concepts are not limited thereto. The storage device may store program time in the spare area.

Figure 13:
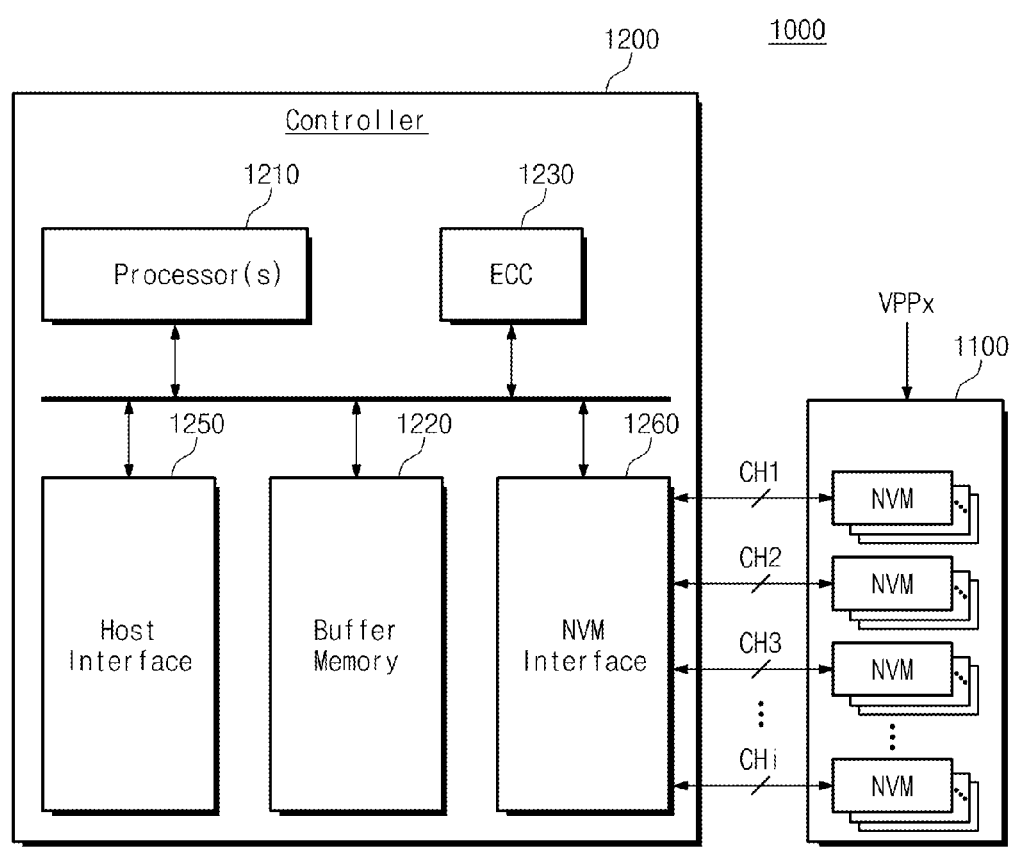
FIGS. 13 to 16 illustrate an application example according to example embodiments of inventive concepts.

Example embodiments of inventive concepts may be applied to a solid-state drive (SSD). FIG. 13 illustrates an application example of an SSD 1000 according to example embodiments of inventive concepts. As illustrated, the SSD 1000 includes a plurality of nonvolatile memory devices 1100 and an SSD controller 1200.

The nonvolatile memory devices 1100 may be implemented to optionally receive an external high voltage Vpp. Each of the nonvolatile memory devices 1100 may be implemented to execute a program operation after floating a common source line CSL, as described with reference to FIGS. 1 to 14. The SSD controller 1200 is connected to the nonvolatile memory devices 1100 via a plurality of channels CH1 to CHi (i being an integer equal to or greater than 2). The SSD controller 1200 includes at least one processor 1210, a buffer memory 1220, an error correction code (ECC) circuit 1230, a host interface 1250, and a nonvolatile memory interface 1260. The processor 1210 may be a hardware processor.

The buffer memory 1220 may temporarily store data used to drive the memory controller 1200. The buffer memory 1220 may include a plurality of memory lines to store data or a command. The memory lines may be mapped to cache lines by various methods. The ECC circuit 1230 may calculate an ECC value of data to be programmed during a write operation, correct an error of data read during a read operation based on the ECC value, and correct an error of restored data from the nonvolatile memory device 1100 during a data restore operation. Although not shown, the SSD controller 1200 may further include a code memory storing code data used to drive the memory controller 1200. The code memory may be implemented using a nonvolatile memory device.

The host interface 1250 may provide an interface function with an external device. The host interface 1250 may be a NAND flash interface. The host interface 1250 may be implemented using various interfaces, other than the NAND flash interface. The nonvolatile memory interface 1260 may provide an interface function with the nonvolatile memory device 1100.

The SSD 1000 may store a program time difference in a page during a program operation and use the stored program time difference during a time table recovery operation to expect performance improvement.

Figure 14:
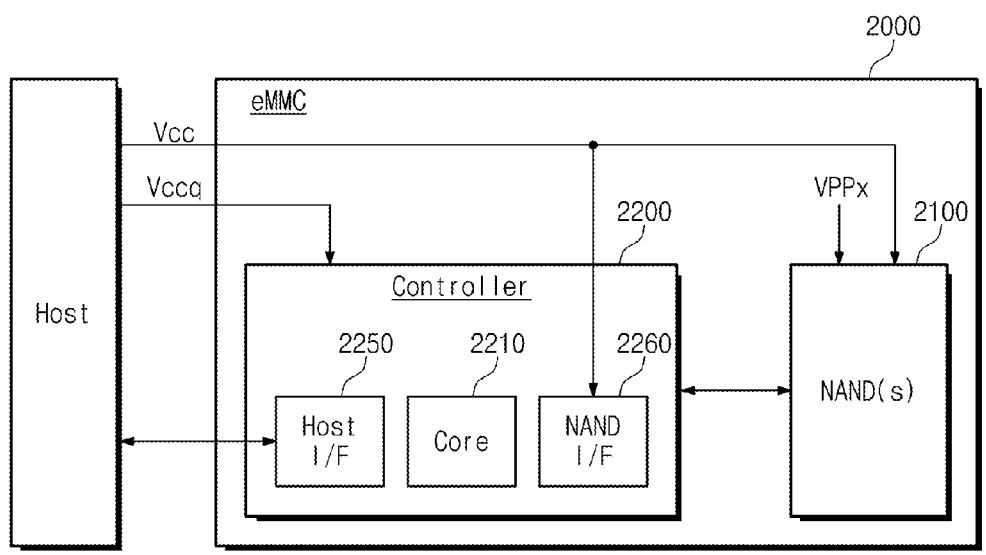

Example embodiments of inventive concepts may be applied to an embedded multimedia card (eMMC), a movi-NAND flash memory, and an iNAND flash memory. FIG. 14 illustrates an application example of an eMMC 2000 according to example embodiments of inventive concepts. As illustrated, the eMMC 2000 may include at least one NAND flash memory device 2100 and a memory controller 2200.

The NAND flash memory device 2100 may be implemented using the nonvolatile memory device described with reference to FIG. 1. The memory controller 2200 is connected to the NAND flash memory device 2100 through a plurality of channels. The memory controller 2200 includes at least one control core 2210, a host interface 2250, and a NAND interface 2260. The at least one control core 2210 controls the overall operation of the eMMC 2000. The host interface 2250 performs host interfacing with the controller 2210. The NAND interface 2260 performs interfacing between the NAND flash memory device 2100 and the controller 2200. In example embodiments of inventive concepts, the host interface 2250 may be a parallel interface (e.g., MMC interface). In other embodiments, the host interface 2250 may be a serial interface (e.g., UHS-II or UFS interface). In other embodiments, the host interface 2250 may be a NAND interface.

The eMMC 2000 receives power supply voltages Vcc and Vccq from a host. A first power supply voltage Vcc (e.g., 3.3 volts) is supplied to the NAND flash memory device 1100 and the NAND interface 1230, and a second power supply voltage Vccq (e.g., 1.8 volts/3.3 volts) is supplied to the controller 1200. In example embodiments of inventive concepts, the eMMC 1000 may optionally receive an external high voltage Vpp.

The eMMC 2000 may recover meta data using a program time difference stored in each page after power-off to significantly reduce open time.

Figure 15:
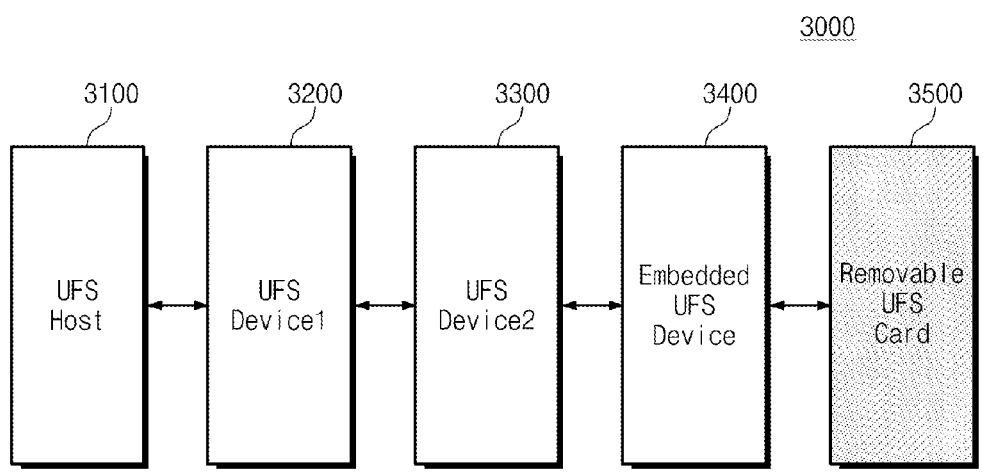

Example embodiments of inventive concepts may be applied to a universal flash storage (UFS). FIG. 15 illustrates an application example of a UFS system 3000 according to example embodiments of inventive concepts. As illustrated, the UFS system 3000 may include a UFS host 3100, UFS devices 3200 and 3300, an embedded UFS device 3300, and a removable UFS card 3400. The UFS 3100 may be an application processor for a mobile device. The UFS host 3100, the UFS devices 3200 and 3300, the embedded UFS device 3300, and the removable UFS card 3400 may communicate with external devices by means of a UFS protocol, respectively. At least one of the UFS devices 3200 and 3300, the embedded UFS device 3300, and the removable UFS card 3400 may be implemented using the storage device 10 shown in FIG. 1.

The embedded UFS device 3300 and the removable UFS card 3400 may communicate with each other by means of another protocol, other than the UFS protocol. The UFS host 3100 and the removable UFS card 3400 may communicate with each other by means of various card protocols (e.g., UFDs, MMC, secure digital (SD), mini SD, micro SD, etc.).

Figure 16:
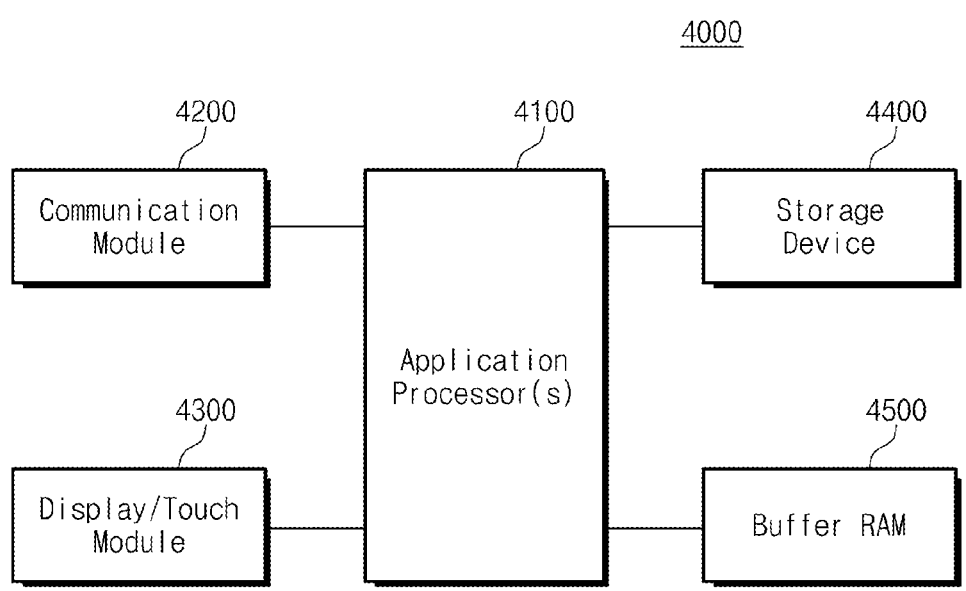

Example embodiments of inventive concepts may be applied to a mobile device. FIG. 16 illustrates an application example of a mobile device 4000 according to example embodiments of inventive concepts. As illustrated, the mobile device 4000 may include an application processor 4100, a communication module 4200, a display/touch module 4300, a storage device 4400, and a mobile RAM 4500.

The application processor 4100 controls the overall operation of the mobile device 4000. The communication module 4200 may be implemented to control wired/wireless communication with an external entity. The display/touch module 4300 may be implemented to display data processed by the application processor 4100 or receive data from a touch panel. The storage device 4400 may be implemented to store user data. The storage device 4400 may be an eMMC, an SSD or a UFS device. The storage device 4400 may be implemented to control a common source line CSL to improve program speed. The mobile RAM 4500 may be implemented to temporarily store data used during a processing operation of the mobile device 4000.

The mobile device 4000 may perform an optimal read operation using a time table to enhance systemic performance.

A memory system or a storage device according to example embodiments of inventive concepts may be packaged as one of various types to be subsequently embedded. For example, the memory system or the storage device may be packaged by one of PoP (Package on Package), Ball grid arrays (BGAs), Chip scale packages (CSPs), Plastic Leaded Chip Carrier (PLCC), Plastic Dual In-Line Package (PDIP), Die in Waffle Pack, Die in Wafer Form, Chip On Board (COB), Ceramic Dual In-Line Package (CERDIP), Plastic Metric Quad Flat Pack (MQFP), Thin Quad Flatpack (TQFP), Small Outline (SOIC), Shrink Small Outline Package (SSOP), Thin Small Outline (TSOP), Thin Quad Flatpack (TQFP), System In Package (SIP), Multi Chip Package (MCP), Wafer-level Fabricated Package (WFP), and Wafer-Level Processed Stack Package (WSP).

According to the storage devices according to example embodiments of inventive concepts and table management methods according to example embodiments of inventive concepts, a program time difference of a previous page is stored during a program operation of a page. A table may be recovered at high speed using the program time difference.

It should be understood that example embodiments described herein should be considered in a descriptive sense only and not for purposes of limitation. Descriptions of features or aspects within each device or method according to example embodiments should typically be considered as available for other similar features or aspects in other devices or methods according to example embodiments. While some example embodiments have been particularly shown and described, it will be understood by one of ordinary skill in the art that variations in form and detail may be made therein without departing from the spirit and scope of the claims. For example, it is possible to adjust the driving capability of a sub word line driver or adjust the slope of level of applied driving signals by changing, adding, or removing the circuit configuration or arrangement in the drawings without departing from the technical spirit of example embodiments of inventive concepts in other cases.

What is claimed is:

1. A table management method of a storage device, the storage device including at least one nonvolatile memory device and a memory controller configured to control the at least one nonvolatile memory device, each of the at least one nonvolatile memory device including a plurality of strings on a substrate and coupled between bitlines and a common source line, the plurality of strings being arranged perpendicular to the substrate, the table management method comprising:

determining whether a table in one of the at least one nonvolatile memory device needs to be recovered, the table associated with a page among a plurality of pages in a block of the one of the at least one nonvolatile memory device;

performing a block scan operation on the block if the table needs to be recovered;

recovering the table using a time difference read from each of the plurality of pages of the block during the block scan operation, the time difference being a time elapsed until a current page among the plurality of pages is programmed from a program time of a previous page among the plurality of pages; and updating the recovered table to the at least one nonvolatile memory device.

2. The table management method as set forth in claim 1, wherein the table is recovered if the storage device is powered on after being powered off.

3. The table management method as set forth in claim 1, wherein the table is recovered according to a user's request.

4. The table management method as set forth in claim 1, wherein the table includes a map table and a time table, the map table is configured to store mapping information between a physical address and a logical address associated with a single page among the plurality of pages in the block, and the time table is configured to store a program time of the single page among the plurality of pages.

5. The table management method as set forth in claim 4, wherein the logical address and a time difference associated with the single page are stored together in a program operation of the single page.

6. The table management method as set forth in claim 5, wherein the time difference is calculated by subtracting a current time generated from a timer from the program time of the previous page.

7. The table management method as set forth in claim 1, wherein
the block is a log block, and
the performing the block scan operation includes determining whether any one of the plurality of pages in the log block is a free page.

8. The table management method as set forth in claim 7, wherein the performing the block scan operation further includes:
searching a read level of the one page if the one page of the log block is not the free page.

9. The table management method as set forth in claim 7, wherein the performing the block scan operation further includes:
deciding a read level of a next page among the plurality of pages using the searched read level and the time difference read from the one page; and
reading the next page based on the decided read level.

10. The table management method as set forth in claim 1, wherein a processing direction of the block scan operation is opposite a processing direction of a program operation.

11. A storage device comprising:
at least one nonvolatile memory device including a plurality of memory blocks on a substrate,
each of the memory blocks including a plurality of strings coupled between bitlines and a common source line,
each of the memory blocks being configured to store a time difference elapsed from a program time of a logical address and a previous page during a program operation,
each of the memory blocks being configured to store a map table to map the logical address and a physical address and a time table to store a program time of at least one page; and
a memory controller configured to control the least one nonvolatile memory device,
the memory controller including,
a timer configured to generate current time, and
a table manager configured to manage the map table and the time table,
the table manager being configured to update or recover at least one of the map table and the time table through a block scan operation, and
the memory controller being configured to determine a read level of a next page in one of the memory blocks using the time difference during the block scan operation.

12. The storage device as set forth in claim 11, wherein the timer is implemented with software, hardware or firmware.

13. The storage device as set forth in claim 11, wherein storage device is configured to recover the map table and the time table using logical addresses and time differences read through the block scan operation on a log block among the plurality of memory blocks if the storage device is powered off after being powered on.

14. The storage device as set forth in claim 11, wherein the at least one nonvolatile memory device is configured to store a program time difference of a previous page in one of the memory blocks during a program operation of a current page in the one of the memory blocks.

15. The storage device as set forth in claim 11, wherein the memory controller is configured to calculate a read level using the time table and to perform a read operation on a single page based on the calculated read level.

16. A table management method of a storage device, the storage device including at least one nonvolatile memory device and a memory controller configured to control the at least one nonvolatile memory device, each of the at least one nonvolatile memory device including a plurality of memory blocks on a substrate, the table management method comprising:
determining whether a table in one of the at least one nonvolatile memory device needs to be recovered, the table being associated with a log block among the plurality of memory blocks in the one of the at least one nonvolatile memory device, the log block including pages 1 to m, m being an integer greater than 1;
performing a block scan operation on the log block if the table needs to be recovered;
recovering the table using information read from the pages 1 to m, the information including time differences 1 to m stored in the pages 1 to m; and
updating the recovered table to the at least one nonvolatile memory device.

17. The table management method as set forth in claim 16, wherein
the performing the block scan operation on the log block includes reading the information from pages 1 to m in a processing direction that is opposite a processing direction of a program operation on the pages 1 to m.

18. The table management method as set forth in claim 16, wherein
the memory controller is configured to program the pages 1 to m in the order of 1 to m,
the one of at least one nonvolatile memory device is configured to store a logical address and a nth one of the time differences 1 to m in an nth page among the pages 1 to m during a program operation of the nth page,
n is an integer greater than 1 and less than or equal to m,
the memory controller is configured to calculate the nth time difference based on a difference between a program time of a (n−1)th page that was programmed before the nth page among the pages 1 to m and a current time generated from a timer in the memory controller.

19. The table management method as set forth in claim 16, wherein
the one of the at least one nonvolatile memory device is configured to store meta data in the table,
the meta data includes at least one of,
mapping information between a physical address and a logical address associated with at least one of the pages 1 to m, and
program times of the pages 1 to m,
the determining whether the table in the one of the at least one nonvolatile memory device needs to be recovered includes determining the table needs to be recovered if meta data is not updated in the table, and
the recovering the table includes using the information read from the pages 1 to m to update the meta data in the table.

20. The table management method as set forth in claim 16, wherein
each of the plurality of memory blocks includes a plurality of strings on the substrate, and each of the plurality of strings including a plurality of memory cell stacked on top of each other between at least one ground selection transistor and at least one string selection transistor.

* * * * *